United States Patent
Cohn et al.

(10) Patent No.: US 6,490,708 B2
(45) Date of Patent: Dec. 3, 2002

(54) METHOD OF INTEGRATED CIRCUIT DESIGN BY SELECTION OF NOISE TOLERANT GATES

(75) Inventors: John M. Cohn, Richmond, VT (US); Scott W. Gould, South Burlington, VT (US); Peter A. Habitz, Hinesburg, VT (US); Jose L. P. Neves, Wappingers Falls, NY (US); William F. Smith, Richmond, VT (US); Larry Wissel, Williston, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 09/812,211

(22) Filed: Mar. 19, 2001

(65) Prior Publication Data

US 2002/0133791 A1 Sep. 19, 2002

(51) Int. Cl.[7] .............................................. G06E 17/50
(52) U.S. Cl. ................................... 716/4; 716/5; 716/6
(58) Field of Search ...................... 716/4, 5, 6; 346/491; 700/121

(56) References Cited

U.S. PATENT DOCUMENTS

| | | | |
|---|---|---|---|
| 5,202,841 A | 4/1993 | Tani ............................. 364/491 |
| 5,459,673 A | 10/1995 | Carmean et al. ............. 364/489 |
| 5,555,506 A | 9/1996 | Petschauer et al. .......... 364/491 |
| 5,596,506 A | 1/1997 | Petschauer et al. .......... 364/491 |
| 5,724,251 A | 3/1998 | Heavlin ........................ 364/491 |
| 5,763,907 A | 6/1998 | Dallavalle et al. ........... 257/202 |
| 5,793,641 A | 8/1998 | Sayah .......................... 364/488 |
| 5,808,899 A | 9/1998 | Scepanovic et al. ......... 364/491 |
| 5,870,312 A | 2/1999 | Scepanovic et al. ......... 364/491 |
| 5,875,117 A * | 2/1999 | Jones et al. .................. 364/491 |
| 5,914,888 A | 6/1999 | Scepanovic et al. ......... 364/491 |
| 5,920,489 A | 7/1999 | Dibrino et al. .............. 364/578 |
| 5,999,714 A | 12/1999 | Conn et al. ............. 395/500.03 |
| 6,029,117 A | 2/2000 | Devgan ........................ 702/58 |
| 6,349,240 B2 * | 2/2002 | Ogawa et al. ............... 700/121 |
| 6,405,349 B1 * | 6/2002 | Gehman et al. ................ 716/4 |
| 6,408,424 B1 * | 6/2002 | Mukherjee et al. ............. 716/5 |

* cited by examiner

Primary Examiner—Tuan T. Lam
Assistant Examiner—Hiep Nguyen
(74) Attorney, Agent, or Firm—Schmeiser, Olsen & Watts

(57) ABSTRACT

A method of integrated circuit design using the selective replacement of increasingly noise tolerant cells is disclosed. The method involves compiling a library comprising a plurality of design element cells, sorting the library into groups of functionally-equivalent cells, and ordering the cells in each group from one extreme to the other extreme value of a featured parameter for which the integrated circuit is to be tested. Each one of the cells in the library have a known value of another parameter so that the substitution of a library cell for an original cell or another library cell does not affect the overall integrated circuit value for that known parameter. A substitution can thus be made with the knowledge that additional problems involving the known parameter are not being created. If a test of the integrated circuit discovers a problem in a particular cell's performance with regard to the featured parameter the appropriate library group is accessed and the failing cell is replaced with the first unused cell in the group. The process is repeated until the integrated circuit passes a performance test.

32 Claims, 7 Drawing Sheets

METHOD OF INTEGRATED CIRCUIT DESIGN BY SELECTION OF NOISE TOLERANT GATES

BACKGROUND OF THE INVENTION

1. Technical Field

This invention generally relates to electronic circuits, and more specifically relates to a method for electronic circuit design.

2. Background Art

Integrated circuits (ICs) are semiconductor devices consisting of many components arranged on a base called a wafer. Semiconductors are formed from material that allows current to flow under certain circumstances, making them indispensable in all sorts of environments from computers to cellular phones to calculators and beyond. ASICs are integrated circuits that are designed to perform a specific function for a specific customer, such as a chip that controls a talking toy or a chip for use in a communications satellite. Frequently an ASIC will share some features with other ASICs previously produced. This partial duplication leads to the creation of standard cell libraries made up of components that perform certain logical functions. These components—the cells—themselves consist of more basic units called devices. When an ASIC's design calls for a certain function to be performed, a cell that accomplishes that function can be selected from the cell library instead of being designed from the ground up. This time-saving step becomes very important when it is considered that large ASIC manufacturers may produce several hundred ASICs in a year.

The design phase of an ASIC includes the performance of various tests to ensure the chip meets critical performance criteria, including the two fundamental concerns in chip design: timing and noise, which are defined in the next two paragraphs. If these or any other chip requirements are not met the chip must be redesigned and retested until they are. The redesign of a circuit involves such steps as altering the physical layout of chip cells, replacing certain cells with new cells, and changing chip parameters like power level or cell size.

The current trend in semiconductor design is toward lower operating power. Lower power means lower voltages supplied to the semiconductor, and lower voltages at which the semiconductor switches. This latter voltage for a cell is called the switching threshold for the cell. This switching threshold for the cell is the value of the input signal such that an input less than this value will be recognized by the cell as a "zero," and an input greater than this value will be recognized as a "one." Because cells work by being switched on or off in response to precise voltage signals, it is important that those signals are not the result of unwanted noise in the circuit. In this context, "noise" refers to an unwanted electromagnetic disturbance that reduces the clarity of a signal. Here, the signal is an input voltage sufficiently far above or below the cell threshold as to be unambiguously recognized as either a "zero" or a "one" telling the cell to turn on or turn off. The disturbance is any such unwanted signal that exceeds the cell threshold and causes the cell to switch falsely. As operating power, and thus power grid supply voltage Vdd and cell switching threshold voltages decrease, noise spike voltages become a greater percentage of the switching threshold and become increasingly problematic, causing an increasing number of false switches.

More common than the false switching problem is the problem of switching delay. This is the timing problem mentioned above. Recall that the semiconductors which are the building blocks of all integrated circuits are materials that sometimes allow and sometimes prevent the flow of current. The opposite states of current flow and current cessation are sometimes referred to as "on" and "off" or as "0" and "1" respectively. Timing errors can occur when adjacent wires undergo transitions that interfere with each other. For example, when one wire, the victim, is attempting a transition from on to off, an adjacent wire, the aggressor, might be transitioning from off to on. While the aggressor's effect might be insufficient to cause a false switch (a voltage rise corresponding to the on position) in the victim, it can sometimes be enough to delay or even reverse for a moment the desired transition in the victim, thus preventing a smooth switch and lengthening the time needed for it. This is one way in which noise problems lead to timing problems.

One approach to fixing the noise/timing problem is to adjust various parameters of the system such as spacing, power, and cell size. Spacing adjustments, for example, are effective because they change the coupling capacitance between adjacent conductors. In other words, because noise can be coupled from one conductor to another by their mutual capacitance, increasing the separation between these wires reduces coupling capacitance and therefore reduces the amount of noise injected.

The effects of such changes or adjustments, whether to spacing, power, or some other parameter, can be predicted with reasonable accuracy; the difficulty lies in the fact that it is nearly impossible to predict exactly which change out of an uncountably large number of possible changes is necessary to fix a specific problem. Trial and error, therefore, becomes the only currently viable solution approach, but is itself severely flawed. Besides being inefficient and time consuming, it is ill-equipped to discover problems early in the chip design process. Yet noise sensitivity problems are best discovered as early in the design process as possible in order to avoid the costs of redesign or reconstruction activity.

There also exist farther drawbacks to the solution approach being described. Each parameter adjustment, besides being impossible to select with confidence, poses potentially unwanted and harmful consequences to other parameters in the system. Every adjustment propagates through the system, potentially degrading performance. Trial and error, clearly, leaves much to be desired as an approach to chip-design improvement.

The prior art describes cell libraries-collections of cells useful in redesigning circuits using this trial and error process. The method of replacing an under-performing original cell with an alternate cell from a pre-built cell library is known. A major problem with this basic approach is that a substitution made to fix a problem with one parameter of the IC often creates one or more problems with other parameters. For example, an original cell underperforming with respect to noise tolerance might be replaced with a more noise-tolerant cell. But that replacement cell may create a new set of timing problems that make it just as problematic as the original. A second replacement cell may have altered power requirements that worsen the problem further. Such introduced problems can propagate through the system, causing trouble spots all along the circuit path. Without a way to guarantee that a replacement cell fixes the problem it is intended to solve without causing new problems in the process, such trial and error substitution could potentially fall into an infinite loop where every attempted fix leads to further problems in IC performance. That is a worst-case and perhaps unlikely scenario but it would not be at all uncommon for trial and error problem solving to take at least several hours. With the demand for ASICs growing steadily, time saving techniques—especially in the time—intensive design phase-are becoming increasingly more important. Therefore, there exists a need to provide an efficient way to address and fix ASIC design problems in a manner that avoids the creation of new problems that can propagate through the system.

DISCLOSURE OF INVENTION

According to the present invention, a cell library is provided, each cell having known values of one parameter but having differing values of another parameter. The library cells are ordered in such a way that successive cells in the order exhibit an orderly incrementation of the parameter being changed. Said another way, the cells are ordered from one extreme to the other extreme value of featured parameter F. In one embodiment of the invention the changing parameter can be noise tolerance and the known parameter can be timing. Other cell parameters including size, power requirements, and current capacity could also be either the changing or the known parameter. This means that a substitution of any cell from the library for any other library cell, or the original cell, will have a negligible effect on, to take the original example, the chip's timing characteristics because that is the parameter held substantially constant or allowed to vary in a known and acceptable way. A chip designer can thus vary the noise tolerances of the IC as needed, confident that such modifications will not create timing problems in the circuit.

It will be understood that the idea of constructing a library with increasing noise rejection, no timing impact, and no size change is of limited use. It can generally be applied to multi-stage cells with limited opportunity for improvement of noise rejection. A more useful approach would be a library with increasing noise rejection and known timing change. Thus, although for simplicity the invention may at times herein be described in terms of a constant or substantially constant parameter, it will be apparent to those skilled in the art that the invention achieves broader utility when the parameter is not necessarily constant, but simply has known and acceptable variation.

One embodiment of the present invention thus involves the provision of a cell library containing IC design element cells sorted into groups of functionally-equivalent cells. Each of the cells in each group have a set of parameters, one of which is a parameter whose value is constant or allowed to vary in an acceptable way, and another of which is a changing parameter, all of which together comprise the total makeup of each cell. After an ASIC is designed its performance with respect to the changing parameter, called featured parameter F, is tested. If problems are found the underperforming cell is marked for replacement, the appropriate library group is accessed, and a replacement cell chosen. The replacement cell is the first unused cell in the library group. This process is repeated until the ASIC performance is satisfactory.

The foregoing and other features and advantages of the invention will be apparent from the following more particular description of certain embodiments of the invention, as illustrated in the accompanying drawings.

BRIEF DESCRIPTION OF DRAWINGS

Certain embodiments of the present invention will hereinafter be described in conjunction with the appended drawings, where like designations denote like elements, and.

MODES FOR CARRYING OUT THE INVENTION

Figure 1:
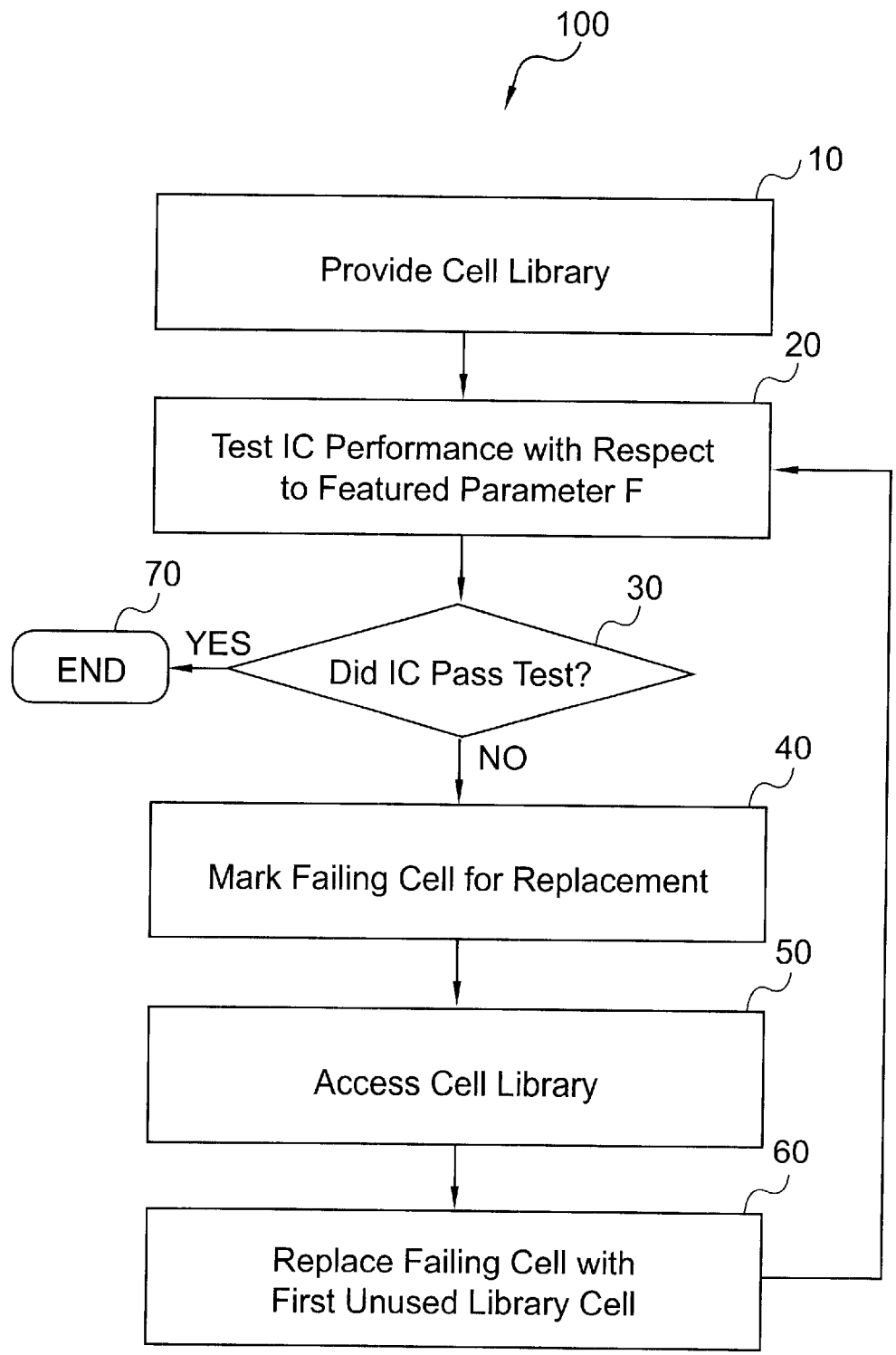
FIG. 1 is a flowchart of the entire procedure constituting one embodiment of the present invention.

One embodiment of the present invention thus involves the steps of:

(a) providing a library of IC design element cells, the library comprising separate groups consisting of functionally-equivalent cells each defined and characterized by their particular values of parameters P, which include, among others, noise toleration, timing response, size, power requirements, and current capacity, one of which, called second parameter S, is held substantially constant or allowed to vary in a known and acceptable way, and another of which, called featured parameter F, is varied in a controlled manner;

(b) testing an integrated circuit to determine whether its performance with respect to featured parameter F is acceptable;

(c) selecting from the appropriate library group, for each failing cell whose performance falls outside of acceptable tolerances for featured parameter F, a particular library cell having a value of featured parameter F that is one increment away from the value of featured parameter F held by the failing cell, and replacing the failing cell with the library cell;

(d) repeating steps (b) and (c) until all cells belonging to the IC perform within acceptable tolerances for featured parameter F.

The replacement carried out in step (c) is likely to improve the IC performance because the library was ordered with that purpose in mind. Said another way, the ordering of library cells in each group is done according to the cells' value of featured parameter F in such a way that successive cells in the order possess values of featured parameter F that are separated by a single increment. What those incremented values are depends on the character of featured parameter F. For example, if featured parameter F is a cell's noise tolerance, the cells in each group will be ordered from lowest to highest toleration for noise. With library groups configured in this way, as cells are selected in turn for testing in the IC, each successive replacement cell is guaranteed to have a higher noise tolerance than the cell it is replacing.

In a second example, featured parameter F might be a cell's size. Here, the cells in each group would be placed in order from smallest to largest and successive selections from the library would yield cells that were increasingly larger in size as the replacement process progressed. It will be understood by those skilled in the art that size increases in discrete increments in terms of space taken up on the chip. In other words, an increase in cell size does not always translate into an increase in chip space used.

Another part of improving IC performance is avoiding the creation of new problems during the resolution of existing ones. It is an important feature of this invention to guarantee that at least with respect to one particular parameter-second parameter S-the overall effect of a replacement cell will be the same as that of the cell being replaced. For example, second parameter S might be a cell's timing response and featured parameter F might again be its noise tolerance. Successive selections of cells from the library would then yield cells with increasing noise tolerance which the user of this method can employ with the knowledge that doing so will produce a modified IC with higher noise tolerance and a timing response that differs in only a negligible way from that of the original IC.

In the following discussion it should be understood that the present invention is advantageously, though not necessarily, embodied in a library arrangement wherein timing response is kept substantially constant or allowed to vary in a known and acceptable way across each cell while cell noise tolerances are incremented in an orderly fashion.

The invention can be thought of as having utility during each of two distinct stages of the design process. The first stage, referred to as pre-physical design, is that period before chip elements are physically placed on the chip. During this stage the chip designer enjoys relatively great latitude in exploiting the invention because cell location has not yet been fixed. This means that cell selection and placement, routing decisions, etc. may all be mapped out with a high degree of efficiency. It will be readily apparent to those skilled in the art that good capacitance/bad capacitance ratios may be usefully determined statistically before actual chip construction begins. Good capacitance is electrically neutral and consists for example of capacitance between chip wires and the substrate, or the capacitance in a wire that drives a load, where no noise is injected. Bad capacitance, in contrast, occurs between adjacent wires and causes noise injection between them. Statistical analysis can determine a ratio between good and bad capacitance for each wire of a unit length even before the wires are in place. That is, the good/bad capacitance ratio gives a good sense of how much voltage an adjacent going pulse will induce on a given wire, and the effects of bad capacitance may be anticipated and compensated for in the subsequent design stages. This type of noise analysis is described in U.S. Pat. No. 5,596,506, incorporated herein by reference.

The second stage of chip design, referred to as post-physical design, occurs later in the process and is when noise fixes have traditionally been undertaken. At this point in the process the method of the invention is more limited in what it can do because the chip elements have actually been placed on the chip. This means that the designer may no longer freely move chip elements from place to place, and no longer has as much freedom to alter the size of the cells. Some alteration of cell sizes is still possible because of the fact, mentioned earlier, that size increases are done in discrete increments, and not every square micron on a chip is used up. On the contrary, a significant percentage of every chip substrate is unused, meaning there is some room both to increase cell size and to alter cell placement. Yet even so it is certainly true that the invention is subject to greater constraints in the post-physical design phase as compared to the greater latitude available in the pre-physical design phase. Thus part of the analysis that the method incorporates is to evaluate how much freedom is available in a given design stage to actually perform the changes that are theoretically possible.

Similarly, a multi-stage cell offers greater opportunities to apply the method of the invention than does a single-stage cell because in a multi-stage cell a change made to improve noise tolerance may be compensated for with another change made elsewhere in the cell. Single-stage cells, in contrast, must be matched up with other cells downstream before the method may be utilized. Said another way, the invention is beneficial in both multi-stage and single-stage cell applications, provided the single-stage cells are paired or grouped with other cells such that changes made in one place may be compensated for by offsetting changes in another place.

Referring now to FIG. 1, method 100 for the improvement of ASIC performance by controlled replacement of under-performing cells includes steps 10 through 70. First step 10 is to provide a cell library that has been arranged in the manner described below. Cells are groups of electronic design elements or components that perform a specific function. The word "cell" thus does not refer to individual transistors, but rather to groups of two or three up to a dozen or more transistors that are arranged so as to behave in a particular way. A typical cell might be a gate or a switch, both of which can be used to control the flow of data in a circuit by connecting and disconnecting various parts of the overall circuit. Cells of these and many other types are included in the cell library so that when this step 10 is completed, various embodiments, as explained further in connection with a subsequent step, of each type of cell that would be found in an ASIC are featured in the library.

The cell library provided in step 10 is sorted into groups of functionally-equivalent cells. Before this sorting procedure takes place, cells of all functional types, whether gates, switches, inverters, multiplexors, or any other type of cell, are all thrown together, so to speak, into the library of the present invention. The sorting process calls for these cells to be placed into groups, each group consisting of cells that perform the same function as each other cell in the group. These functionally-equivalent cells should not be understood to be identical in every way; on the contrary, each cell could be different from the other cells in its group in a variety of ways, as for example in size, power level, or any one of the numerous parameters that characterize a cell. Indeed, the very essence of the library idea is that at least one parameter common to the cells in a group is deliberately selected so that it varies across all such cells. This particular parameter is referred to as featured parameter F. The meaning of functional equivalence, rather, is that all cells in a group perform the same way when they are inserted into an IC. Thus all cells from one group in the library will act, for example, as switches and control the flow of data in a circuit, while all the cells from another group would perform some other function necessary for the operation of an integrated circuit.

The foregoing paragraph highlighted the fact that the cells comprising the library groups have at least one and potentially several differences. Second parameter S may or may not have differing values across library cells. Depending on the design of the ASIC, as well as other considerations, second parameter S may be substantially constant from one cell to another or it may vary from cell to cell. The important thing is that it vary in a way that only negligibly affects the IC's performance with respect to that parameter. One consideration important in this regard is whether or not a cell is on the critical timing path. Using the type of incremental static timing available in a PDS system, it would be quite easy to determine if the timing impact of the cell replacement must be propagated. If the timing change induced is dominated by the delays of other, unrelated signals, i.e., the nets driven by the cell to be changed are not on the critical timing path before the cell change, and are still not on the critical path after the replacement, the timing effect of the change does not propagate and there would be no need to iterate to repair the logic.

In one embodiment of this invention, second parameter S is the cell's timing response. In other embodiments it could be noise tolerance, voltage level, or any one of the many parameters that characterize the library cells, some of which have been mentioned elsewhere in this description of the invention. In the embodiment where second parameter S is the cell's timing response and featured parameter F is its noise tolerance, a substitution of a library cell for the original (underperforming) IC cell will result in an IC with greater tolerance for noise but a timing response that is substantially unchanged from the original. This process is explained in more detail in connection with the subsequent steps below. It can perhaps already be appreciated at this stage of the discussion, however, that the ability to make a substitution that improves IC response with respect to one parameter while guaranteeing that another parameter will be unaffected by the substitution, is very valuable.

After the library has been sorted into groups of functionally-equivalent cells, the cells in each group must be ordered according to their value of featured parameter F. This ordering process will now be explained using noise tolerance as that parameter. In this and the next paragraph, then, for simplicity, the words "noise tolerance" will be used in place of the words "featured parameter F." However, it should be understood that, as explained above, noise tolerance is only one of a number of parameters that could be designated as the featured parameter.

There are many things that can be done in order to increase the noise tolerance of a cell. Some of these are to increase the positive or negative noise threshold voltage, modify transistor parameters, or increase the physical size of the cell. Thus those cells characterized by lower bias voltage, smaller internal wire separation, or smaller size will be closer to the beginning of the order in their particular library group, while those with higher input voltage, larger internal wire separation, or larger size will be placed nearer the back of the order.

It will be useful here to define more carefully what is meant by the "size" of a cell. Cell size is measured in terms of surface area covered on the silicon die. The two dimensions that comprise this measurement are often referred to as width and length in this context. A larger cell could be thought of as being wider than a smaller cell, as it is made up of devices which themselves might be wider than the devices comprising the smaller cell. Cell size, then, is a straightforward concept-it simply refers to the cell's actual footprint, or physical dimensions, on the die or substrate.

One could perhaps place the odds of a successful cell substitution in one's favor by simply selecting and using the cell with the greatest noise tolerance to the polarity of noise which has been identified as a problem to begin with, but this approach ignores the fact that bigger cells are undesirable in that they increase the cost and decrease the efficiency of the ASIC being designed. It is for this reason that the groups are arranged from lowest to highest tolerance to the particular polarity of noise that has been identified as a problem. Noise polarity manifests itself as a positive-going excursion from a signal intended to be a "zero," and also as a negative-going excursion from a signal intended to be a "one." When ordered this way, the first cell in the group will be only slightly more noise tolerant than the original cell being replaced, but will also present the smallest downside in terms of increased size, etc. that make the replacement library cells less desirable than the original cell.

Referring still to FIG. 1, second step 20 of method 100 is to test the integrated circuit's performance with respect to featured parameter F. If featured parameter F is noise tolerance, as in several previous examples, there is more than one way to do this, including circuit or timing simulation techniques such as SPICE, or by predicting peak noise within a victim circuit of the IC in the manner described in U.S. Pat. No. 6,029,117 awarded to Anirudh Devgan. Whatever the method used, and whatever the identity of featured parameter F, the purpose of this step is to detect and identify those cells that do not perform up to the standards established for the IC.

Step 30 is to ask whether the IC passed the test, or in other words, to analyze the results of the test performed in the previous step 20. It involves comparing the IC's performance as determined in step 20 with the performance standards established by the IC customer or manufacturer. If the performance satisfies those standards the appropriate next step would be step 70. If the performance is not satisfactory then the process continues with step 40.

Step 40 is to mark the failing cell for replacement. Here the cell that performs in a substandard fashion is identified and marked so that it will be clear that the substandard cell has already been tried and rejected in the IC. This ensures that the substandard cell will not be selected a second time when its lack of fitness in a particular IC has already been established. The cell's function is also determined so that its replacement may be chosen from the appropriate library group. The marking performed in this step may be accomplished in a variety of ways but the essence of the procedure is to keep track of cells that have been used in the integrated circuit so they will not be used again. This could be accomplished by something as simple as maintaining a list of the cells that have been used unsuccessfully, identifying such cells by, for example, their value of featured parameter F.

The next step 50 of method 100 is to access the cell library for the purpose of choosing a replacement cell. Because the library has in an earlier step been sorted into groups containing functionally-equivalent cells, the search for a replacement cell may be confined to the group whose members perform the same function the failing cell does. In this step 50, only that group is accessed and searched.

Step 60 calls for the replacement of a failing cell with the first unused library cell. If the current loop through the procedure is the initial one, none of the library cells will have been marked as explained in connection with step 40 and the appropriate replacement will be the first cell in the order. If one or more replacements have been tried and have failed prior to the current iteration, the replacement cell will be located farther down the order. In any case, the first unused library cell will be the first one in the appropriate library group that has not been marked in step 40. The importance of that step can now be seen. Once a cell has been tested and rejected for substandard performance in the IC, the step 40 marking prevents a failing cell from being selected on a subsequent iteration. Step 60 is followed by step 20, as shown by the arrow connecting those steps in FIG. 1. When step 20 follows step 60, as it does on every loop through the procedure except the initial one, step 20 serves to test the success of the replacement accomplished in the step 60 that preceded it.

Step 70 is the final step of method 100, reached only after the IC goes through a complete testing cycle with no errors being reported. It is unimportant whether this occurs on the first time through the process or after one or more iterations.

It should be understood that the repetitive process described is one of, but not the only, acceptable solution. In fact, the methodology has sufficient information to circumvent repetition, and in one embodiment, the repetitive selection of library cells is unnecessary because their noise immunity is known before hand. The first cell selected always has sufficient noise immunity to satisfy the testing described above with the minimum timing impact.

Figure 2:
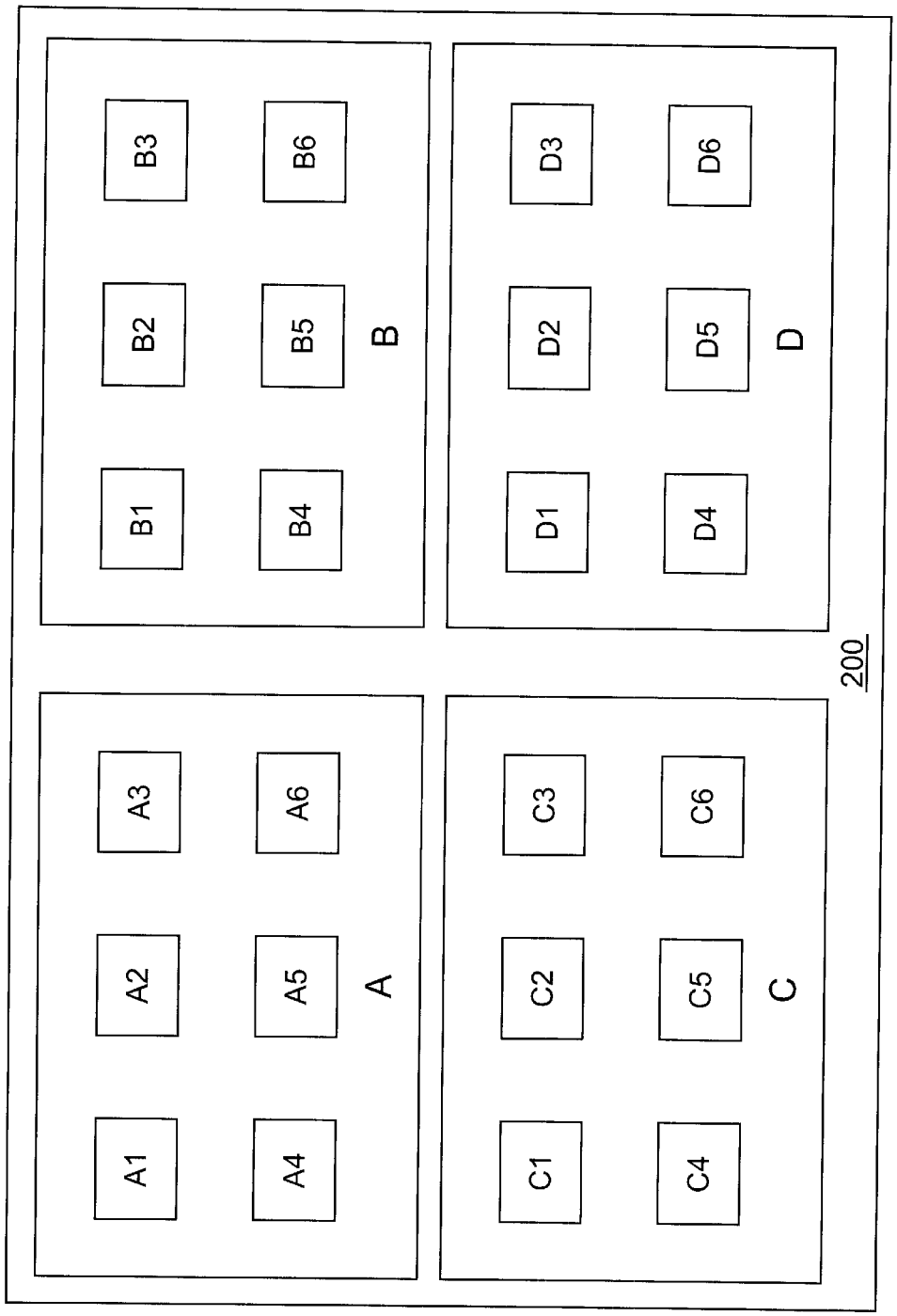
FIG. 2 is a schematic of a cell library of the present invention showing the arrangement of cells therein.

Referring now to FIG. 2, cell library 200 has been sorted and arranged in the manner described in connection with FIG. 1. Specifically, each cell has been placed in a group with all the other cells in cell library 200 that perform the same function that it does. In the FIG., groups A through D are shown, and these should be understood to be representative of the total number of groups in cell library 200, which number is equal to the total number of different cell functions embodied in cell library 200. Each group A through D is shown containing six cells, although each group could have more or fewer cells than the number shown. In practice it might be desirable to place just two cells in each group, representing a low value and a high value of featured parameter F. The cells in each of groups A, B, C, and D have been further sorted in a manner consistent with the foregoing discussion, i.e., from one extreme value to the other extreme value of featured parameter F.

Cell library 200 contains cells with featured parameter F and second parameter S, as well as numerous other parameters which together define and characterize the cells.

Featured parameter F is the parameter with respect to which the IC is being tested, and in one embodiment is the noise response of a cell. Second parameter S is the cell parameter being carefully observed to ensure that its value does not interfere with the performance of the chip. In one embodiment this is the cell's timing response. The other parameters could be one or more of: size, power requirements, and current capacity, where the foregoing list is offered by way of illustration and not limitation.

When an IC is tested as outlined as in step 40 of FIG. 1, the function performed by the failing cell, if any failing cells are found, is determined so that the proper group within cell library 200 may be accessed for a replacement. Because each group has been organized according to cell function, the search for a replacement cell may be confined to the single group consisting of cells that share the failing cell's functionality.

Figure 3:
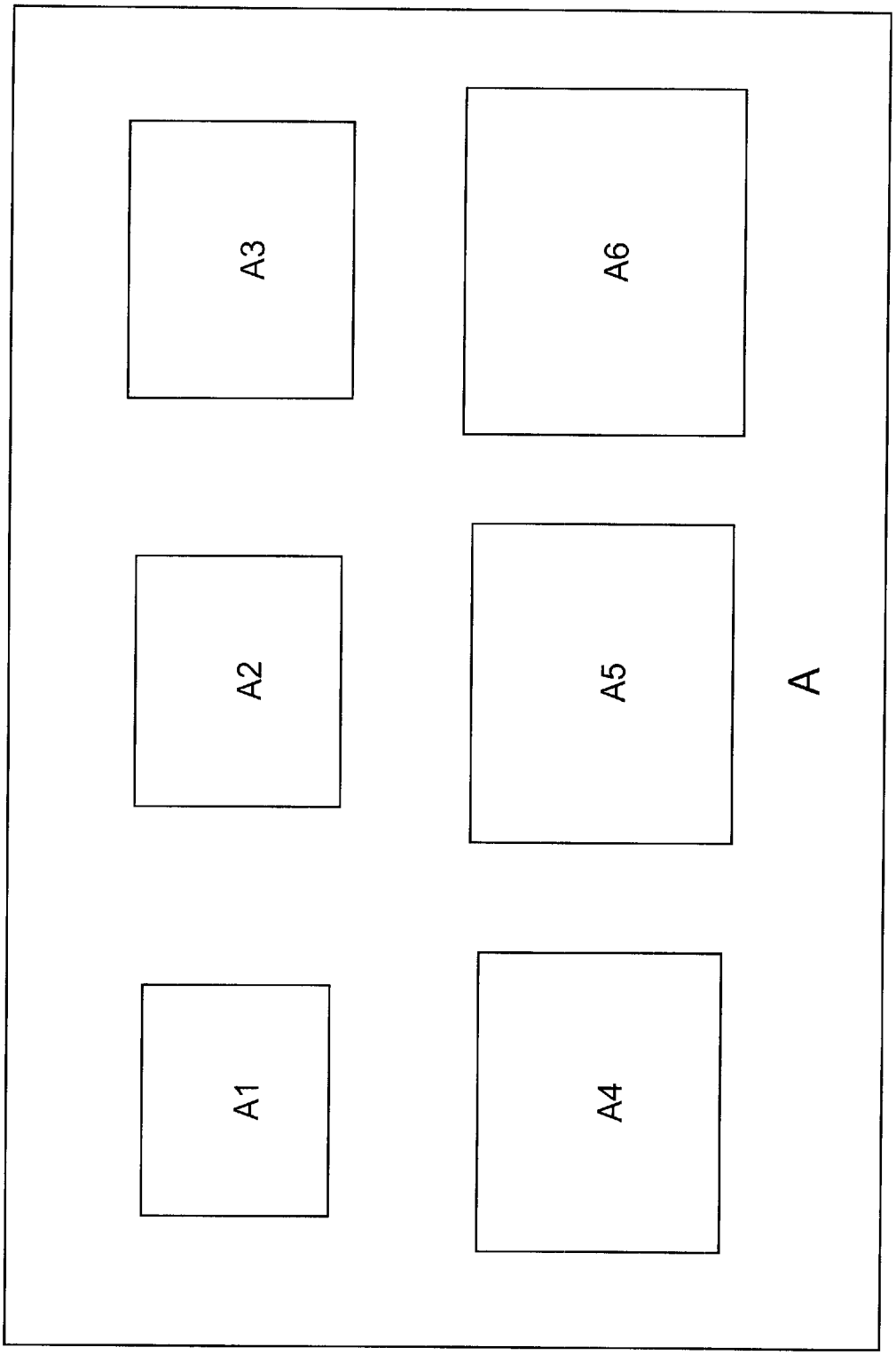
FIG. 3 is an expanded view of one of the library groups from FIG. 2.

With reference to FIG. 3, library group A contains cells A1 through A6. Cell A1 has the lowest noise tolerance of the six cells in library group A. Cell A6 has the highest noise tolerance of the cells in the group. One of the things that may be done to increase noise tolerance is to increase a cell's input threshold voltage, meaning that the altered cell must see a greater voltage than does its unaltered counterpart before it switches to its alternate state. However, because the timing response of each cell must be adjusted, in order that substitutions of the sort contemplated do not create unexpected timing problems in the IC being built, the higher voltage must be compensated for by increasing the physical size of the cells. Those cells with slightly higher positive or negative noise threshold voltage than the failing original cell, such as cells A1 and A2, are slightly larger than the original cell. Cells A3 through A6 are increasingly larger to compensate for their increasingly greater input voltage values. Smaller cells are desirable because they take up less space on the chip and are therefore cheaper and easier to make. It is for this reason that smaller library cells are used as substitutes first, in the hope that they, with their only slightly increased noise tolerance, will be suitable and that the use of larger replacement cells may be avoided.

It is often the case that a cell may have different noise immunity depending on the polarity of the impinged noise pulse. This is controlled by the type of circuitry and the manufacturing process. Separate noise signals for positive going and negative going noise apply to each net and yield different results when compared to the cells' polarity-dependent noise rejection. This polarity dependence can be advantageous to the noise correction process. Increasing nfet device width while decreasing pfet device width (and vice versa) results in a cell with improved noise tolerance to negative going noise at the expense of tolerance to positive going noise. The cell's input capacitance is not changed if the total nfet and pfet device width remains constant. Similarly, exchanging high Vt devices for standard Vt devices will yield improved noise tolerance and neutral input capacitance at the expense of cell delay and potentially increased manufacturing costs to support the different Vt device.

Figure 7:
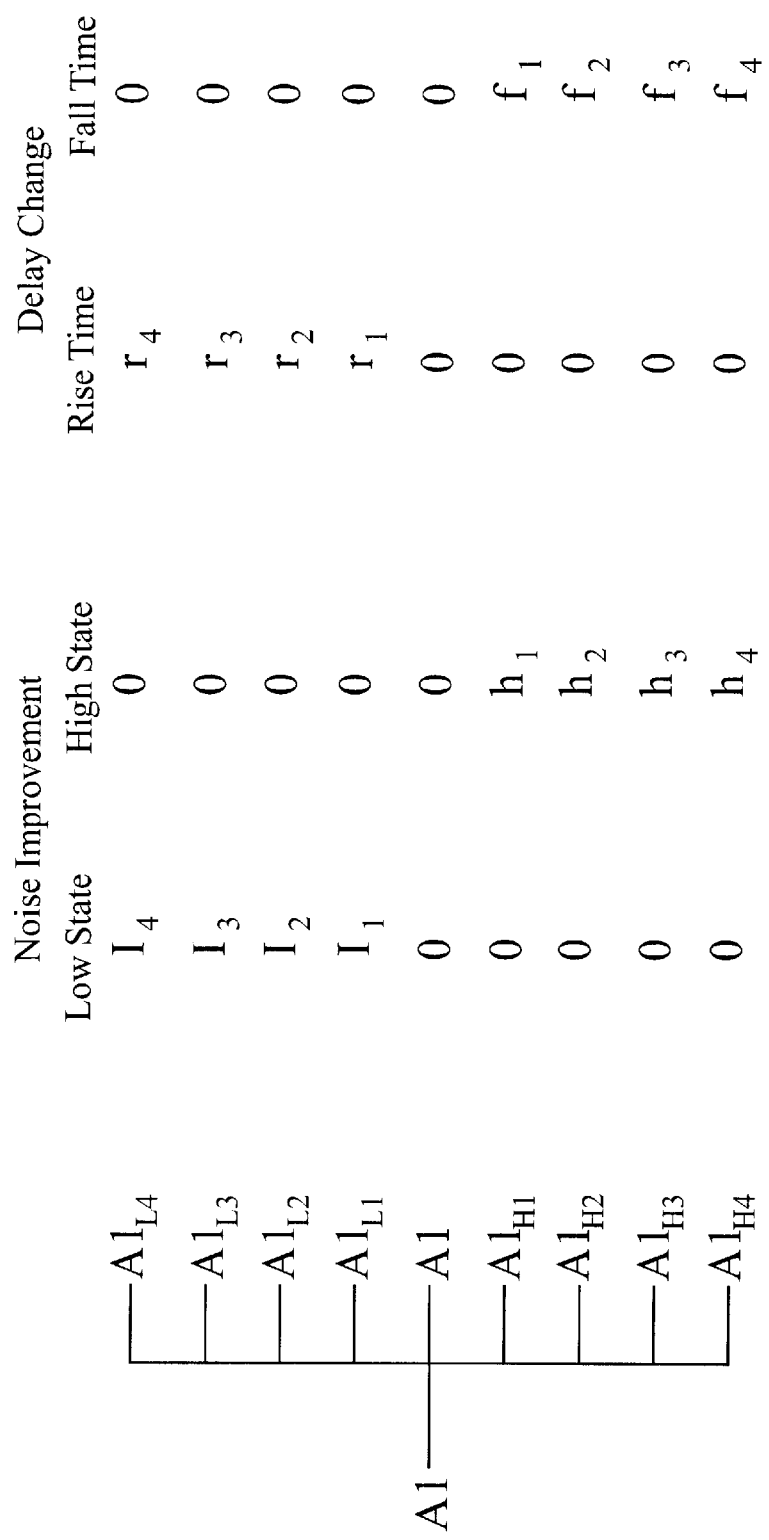
FIG. 7 is a table describing various states of the library cell A1 from FIG. 3.
Figure 8:
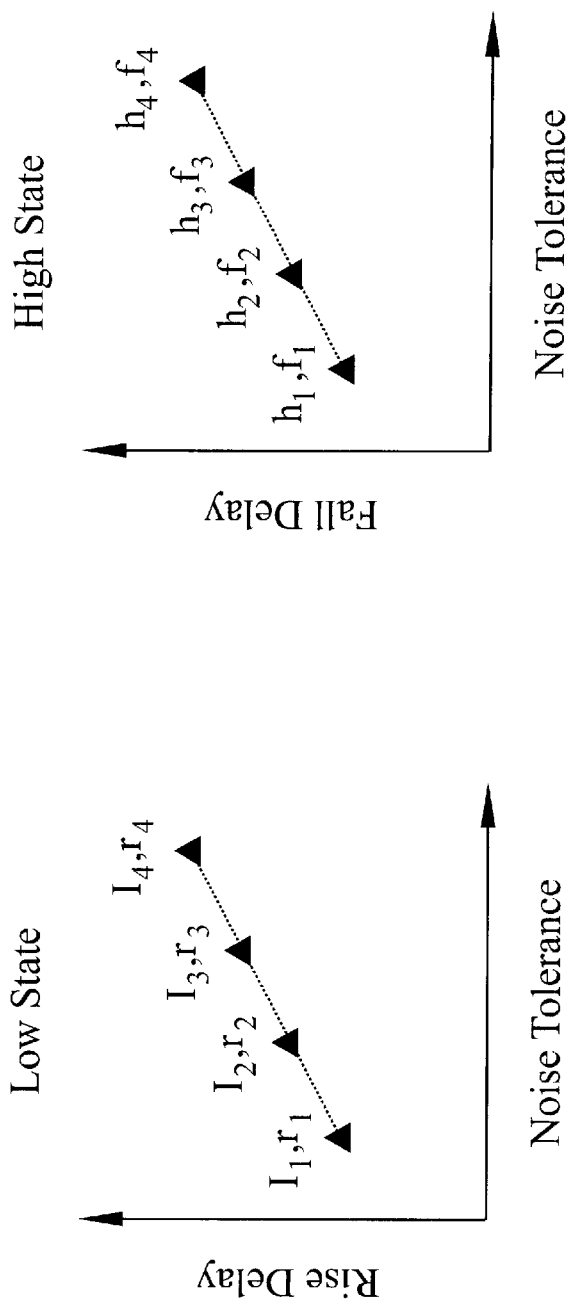
FIG. 8 shows the relative grading of noise immunity and delay for the library described in FIG. 7.

FIG. 7 is an extension of FIG. 3 describing the grading of library cell A1 for low state (L1–L4) and high state (H1–H4) noise immunity while maintaining a substantially constant cell size. Each row represents a cell functionality equivalent to A1 with increased noise immunity and decreased performance to signals switching in one direction. FIG. 8 shows the relative grading of noise immunity and delay for the library described in FIG. 7.

Figure 4:
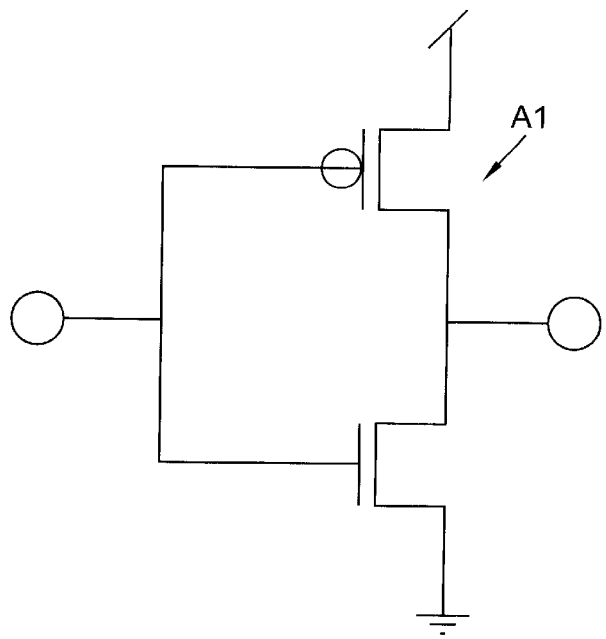
FIG. 4 is a diagram of a representative cell in the cell library of this invention.

FIG. 4 is a diagram of a representative cell in the cell library of this invention. In the discussion accompanying this FIG. 4 and the following FIG. 5, as well as in the two FIGS. themselves, an embodiment is assumed where featured parameter F is noise tolerance and second parameter S is timing response. These assumptions are meant to be illustrative rather than limiting and should be regarded in that spirit.

Cell A1 of FIG. 4 is a simple inverter consisting of two individual devices, or transistors. Recall that each cell in cell library 200 is made up of some small number of devices, generally a dozen or so. Cell A1 represents the first cell in group A of cell library 200. Cell A1 has a noise tolerance greater than the functionally-equivalent cell originally used in the IC under construction. If that original cell fails to perform satisfactorily its function will be determined, cell library 200 will be accessed, the appropriate group, here represented by group A, will be located, and cell A1, the first unused cell in the group, will be selected. At that point the IC will again be tested and, unless cell Al is found to be an adequate replacement, the process will be repeated.

Figure 5:
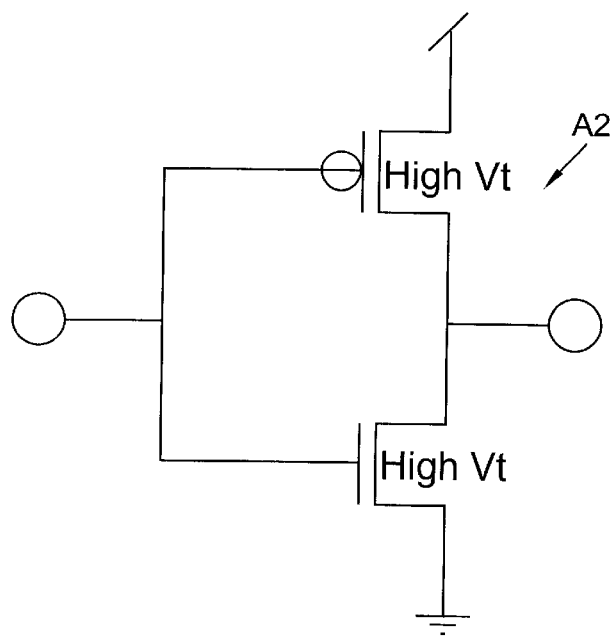
FIG. 5 is a diagram of a different cell in the cell library chosen from the same group as the one to which the cell shown in FIG. 4 belongs.

Referring now to FIG. 5, cell A2 is an inverter that performs the same function as cell A1 from FIG. 4. Cell A2, however, has been constructed using one device with a higher threshold voltage Vt than was used in the devices comprising cell A1. This selective use of the higher device threshold increases the tolerance of cell A2 to positive-going noise as compared to cell Al but it also requires further alterations if its timing response is to remain equivalent to the timing response of cell A1. In the context of FIG. 7, cell A2 represents the cells $A1_{H1}$–$A1_{H4}$. The selective use of a high Vt device alters the switching threshold of cell A2 such that cell A2 requires a higher input signal to cause it to switch. For reasons explained in connection with FIG. 6 this helps achieve the goal of increased tolerance to positive-going noise, but it hinders the goal of leaving timing response unchanged. Timing is a factor of both the cell switching threshold and the dimensions—width and length—of the devices comprising the cell.

Figure 6:
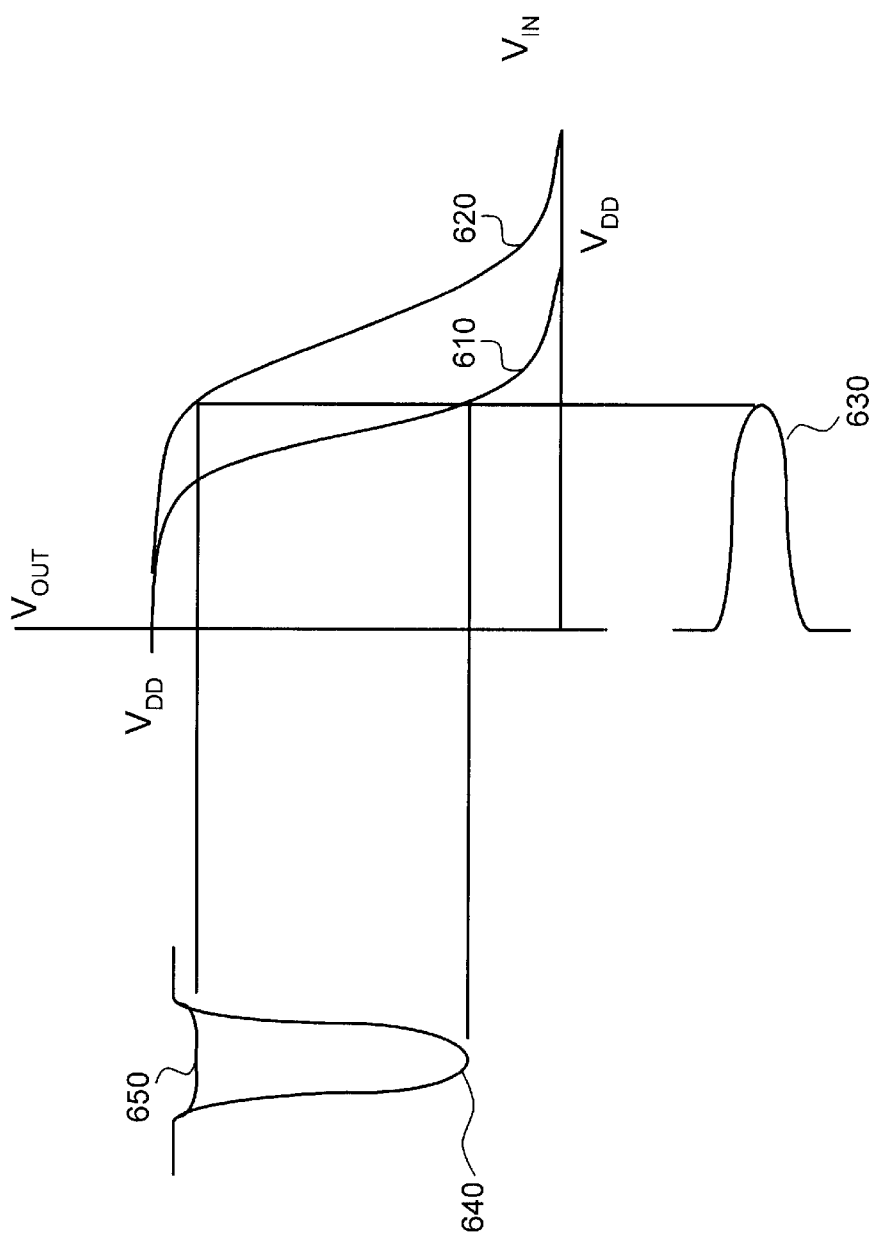
FIG. 6 is a graph showing the effect of a noise spike on the cells of FIG. 4 and FIG. 5.

Referring now to FIG. 6, two different cells with different immunity to noise are represented by curves 610 and 620 which relate the cell input voltage to the cell output voltage. The input voltage value (x-axis) where the curve is steep is the switching threshold; the cells represented by these curves 610 and 620 have different switching thresholds. The cell represented by curve 620, referred to also as cell 620, has a greater immunity to positive-going noise excursions from an intended digital input value of "zero." this is illustrated by showing a noise pulse 630, where the input voltage briefly goes positive with respect to the intended value of "zero." The response of the cell represented by curve 610, referred to also as cell 610, to input 630 is shown as curve 640; the low immunity of cell 610 to positive-going noise manifests itself as a large output signal from cell 610. By contrast, the cell 620 has greater immunity to positive-going noise, and its response to input 630 is shown as curve 650. The significant noise represented by input 630 is essentially rejected by cell 620 due to its higher immunity.

While the invention has been particularly shown and described with reference to certain embodiments thereof, it will be understood by those skilled in the art that various changes in form and details may be made therein without departing from the spirit and scope of the invention. Language reflecting that fact has been used in numerous places throughout the foregoing description of the invention.

We claim:

1. A method of integrated circuit design comprising the steps of:
   (a) providing a library of integrated circuit design element cells, said library comprising separate groups of functionally-equivalent cells, each of said cells in each of said groups having parameters P among which are featured parameter F and second parameter S, said cells being ordered from one extreme value to the other extreme value of said featured parameter F;
   (b) testing an integrated circuit to determine whether its performance with respect to said featured parameter F is within acceptable tolerances;
   (c) selecting from the appropriate one of said groups in said library, for each failing cell whose performance falls outside of acceptable tolerances for said featured parameter F, a particular library cell having a value of said featured parameter F that is one increment away from the value of said featured parameter F held by said failing cell and replacing said failing cell with said library cell;
   (d) repeating steps (b) and (c) until all cells belonging to said integrated circuit perform within acceptable tolerances for said featured parameter F.

2. The method of claim 1 where said featured parameter F is the noise tolerance of said functionally-equivalent cells.

3. The method of claim 2 where said noise tolerance is successively increased by increasing in successive increments the threshold voltage of said successive cells.

4. The method of claim 1 where said second parameter S is the timing response of said functionally-equivalent cells.

5. The method of claim 4 where said timing response is kept substantially constant by increasing the size of said cells.

6. The method of claim 4 where said timing response is kept substantially constant by varying nfet and pfet device parameters in a multi-stage cell.

7. The method of claim 4 where said second parameter S is allowed to vary.

8. The method of claim 4 where said second parameter S is allowed to vary if the timing effect of the change does not propagate through said integrated circuit.

9. The method of claim 1 where said parameters P are one or more of: size, power level, noise tolerance, timing response, and current capacity.

10. The method of claim 1 where each of said groups in said library contains two cells.

11. The method of claim 10 where the first of said two cells has a normal value of said featured parameter F, and the second of said two cells has a high value of said featured parameter F, said normal value being lower than said high value of said featured parameter F.

12. The method of claim 1 where said steps b and c are automated.

13. The method of claim 1 where said steps a, b, c, and d are automated.

14. A library useful in integrated circuit design, said library being a collection of components known to be useful in integrated circuit technology and designed to perform particular functions, said library comprising at least one group of functionally-equivalent library cells, said cells having parameters P among which are featured parameter F and second parameter S, said cells in said group being ordered from one extreme to the other extreme value of said featured parameter F.

15. The library of claim 14 where said featured parameter F is the noise tolerance of said functionally-equivalent cells.

16. The library of claim 14 where said second parameter S is the timing response of said functionally-equivalent cells.

17. The library of claim 14 where said parameters P are one or more of: size, power level, noise tolerance, timing response, and current capacity.

18. The library of claim 14 where each of said at least one group in said library contains two cells.

19. The library of claim 18 where the first of said two cells has a normal value of said featured parameter F, and the second of said two cells has a high value of said featured parameter F, said normal value being lower than said high value of said featured parameter F.

20. A method of integrated circuit design comprising the steps of:
   (a) providing a library of integrated circuit design element cells, said library comprising separate groups of functionally-equivalent cells, each of said cells in each of said groups having different noise tolerances, known timing response, and various values of at least: size, power level, and current capacity; and
   (b) testing an integrated circuit to determine whether its noise tolerance is acceptable.

21. The method of claim 20, further comprising the steps of:
   (c) selecting from the appropriate one of said groups in said library, for each cell whose noise tolerance is unacceptable, a particular cell having a noise tolerance that is one increment higher than the noise tolerance of said cell whose noise tolerance is unacceptable; and
   (d) repeating steps (b) and (c) until all cells belonging to said integrated circuit possess acceptable noise tolerance.

22. The method of claim 21 where each of said groups in said library contains two cells.

23. The method of claim 22 where the first of said two cells has a normal noise tolerance and the second of said two cells has a high noise tolerance, said normal noise tolerance being lower than said high noise tolerance.

24. The method of claim 21 where said steps b and c are automated.

25. The method of claim 21 where said steps a, b, c, and d are automated.

26. The method of claim 21 where said noise tolerances are successively increased by increasing in successive increments the threshold voltage of said successive cells.

27. The method of claim 21 where said timing response is kept substantially constant by increasing the size of said cells.

28. The method of claim 21 where said timing response is allowed to vary.

29. The method of claim 21 where said timing response is allowed to vary if the timing effect of the change does not propagate through said integrated circuit.

30. A library for use in integrated circuit design, said library being a collection of components known to be useful in integrated circuit technology and designed to perform particular functions, said library comprising at least one group of functionally-equivalent library cells, said cells having different noise tolerances, known timing response, and various values of at least: size, power level, and current capacity.

31. The library of claim 30 where each of said at least one group in said library contains two cells.

32. The library of claim 31 where the first of said two cells has a normal noise tolerance and the second of said two cells has a high noise tolerance, said normal noise tolerance being lower than said high noise tolerance.

* * * * *